United States Patent [19]
Fajardo

[11] Patent Number: 6,088,231
[45] Date of Patent: Jul. 11, 2000

[54] RF AND EMI SHIELD

[75] Inventor: Iggoni Fajardo, Fremont, Calif.

[73] Assignee: Methode Electronics, Inc., Chicago, Ill.

[21] Appl. No.: 09/261,618

[22] Filed: Mar. 3, 1999

[51] Int. Cl.[7] ........................................... H05K 9/00
[52] U.S. Cl. ..................... 361/737; 361/752; 361/799; 361/816; 174/35 R
[58] Field of Search ..................... 361/752, 737, 361/799, 816, 818; 174/35 R, 51; 439/607–610; 257/660; 211/41.17; 206/719

[56] References Cited

U.S. PATENT DOCUMENTS

| | | | |
|---|---|---|---|
| 5,005,106 | 4/1991 | Kiku . | |
| 5,014,160 | 5/1991 | McCoy, Jr. . | |
| 5,206,796 | 4/1993 | Thompson et al. . | |
| 5,252,782 | 10/1993 | Cantrell et al. .......................... | 174/25 R |
| 5,323,299 | 6/1994 | Weber ...................................... | 361/818 |
| 5,333,100 | 7/1994 | Anhalt et al. ............................ | 361/818 |
| 5,335,147 | 8/1994 | Weber ...................................... | 361/818 |
| 5,397,857 | 3/1995 | Farquhar et al. ....................... | 174/52.1 |
| 5,409,385 | 4/1995 | Tan et al. ................................ | 439/76 |
| 5,476,387 | 12/1995 | Ramey et al. .......................... | 439/76.1 |
| 5,505,628 | 4/1996 | Ramey et al. .......................... | 439/76.1 |
| 5,572,408 | 11/1996 | Anhalt et al. ........................... | 361/737 |

*Primary Examiner*—Leo P. Picard
*Assistant Examiner*—Jayprakash N. Gandhi
*Attorney, Agent, or Firm*—Karl D. Kovach; David L. Newman

[57] ABSTRACT

A shield for a PCB package for shielding electromagnetic radiation from exiting or entering the package. Typically, the package includes first and second electrically conductive covers and first and second frames. A printed circuit board fits within the shield, and the shield fits within the first and second covers and frames. The shield has side walls which surround a perimeter of the printed circuit board so as to prevent electromagnetic radiation from entering and exiting through the first and second frames of the package. The shield also has ground springs which electrically connect the shield with the first and second covers so as to insulate the printed circuit board from electromagnetic radiation radiating to and from directions perpendicular to planes of the first and second covers. The shield also includes side springs which attached to the side walls and press against a side edge of one of the first and second frames so as to secure the shield within the package. Optionally, the shield can include ground clips attached to the side walls which contact the printed circuit board so as to electrically connect the printed circuit board to the shield. A further option is to provide a removed portion in one of the side walls so as to enable a connector of an input/output device to pass through the side wall of the shield.

34 Claims, 3 Drawing Sheets

RF AND EMI SHIELD

BACKGROUND OF THE INVENTION

1. Field of the Invention

The present invention relates to memory media and input/output device packages, wireless applications and the telecommunication industry. The invention more particularly concerns a shield for the shielding of contents of a package from the effects of radio frequency and electromagnetic interference or radiation. Typically the shield holds a printed circuit board within the package, where the package conforms to the standards set by PCMCIA, JEIDA, ISO, CFA, CF Plus, miniature card, small PMCIA card, and etc. for peripheral devices.

2. Discussion of the Background

The current trend in the computing hardware, telecommunications and electronics industries is to miniaturize components and devices and to place as many of the components and devices next to each other so as to provide quality technical performance in a small package. Hardware that conveys electricity, such as a wire or printed circuit board (PCB), radiates electromagnetic radiation. The hardware is also susceptible to electromagnetic radiation radiated from other sources. The electromagnetic radiation effects the hardware by corrupting or altering the electrical signal that the component conveys. Such corruption of an electrical signal in a component is not tolerable. The power and associated affect of the electromagnetic radiation field diminishes with distance from the source of the electromagnetic radiation. Therefore, the closely placed electronic components and devices disadvantageously influence each other by radiating electromagnetic fields. Placement of electronic components and devices in close proximity to each other would be acceptable if the effects of the electromagnetic radiation emanating from each device could be muted or lessened to a degree where the electromagnetic radiation emanating from each device does not corrupt the electrical signals being conveyed by other components or devices.

Furthermore, shielding is especially important in high speed data transfer situations, such as in fiber optic applications.

Furthermore, another need of the industry is to produce rugged PMCIA-style cards, and I/O device cards or packages which are capable of being handled by end-users in a rough manner or environment. End-users, in use, tend to impart bending and torsional loads on the packages. After being subjected to such loads, the contents of the packages do not operate properly.

Prior art PMCIA cards typically have two sheet metal covers which are joined together by a plastic frame molded around each cover, as disclosed in U.S. Pat. No. 5,397,857. U.S. Pat. No. 5,397,857 is hereby incorporated by reference. The electrically conductive, sheet metal of the top and bottom covers provide a shielding effect against the transmission of electromagnetic radiation through the top and bottom covers. Other cards have plastic covers which result in electromagnetic radiation being transmitted through the covers. A seam is formed where the top cover and the bottom cover meet. Electromagnetic radiation is able to pass through the region of the seam since the seam is substantially constructed of plastic material which is, in its natural state, electrically non-conductive, where the plastic material does not provide a shielding effect against electromagnetic radiation, whether the electromagnetic radiation is radiated from components within the PCMCIA card or whether the radiation is radiated from other components external to the PCMCIA card and passes through the seam and into the interior of the PCMCIA card. The PCMCIA card can be completely constructed of plastic material and the two halves of the package can be sonically bonded or laser welded. Such leakage issues are also present in compact flash packages, miniature cards, and other PC card packages, where the term PC card package is inclusive of any package which can contain electrical components, such as the devices described above, and is not to be limited by any narrow definition of the term as used in trade groups.

Other prior art packages employ a clip, veneer, or rail of conductive material positioned around the side edges of the package so as to shield against electromagnetic radiation, as disclosed in U.S. Pat. No. 5,333,100. This approach causes the overall dimensions of the resulting package to exceed the standards set by industry. Another prior art solution, such as U.S. Pat. Nos. 5,505,628 and 5,476,387, employ the use of covers that have mechanical overlaps which attach one cover to the other cover at discrete intervals along the side edge of the package. The mechanical overlaps electrically ground the two covers to each other. The mechanical overlaps traverse or cross over the side edge of the package, as such, only intermittent shielding is provided, which is not acceptable. Such solutions, however, adds to the size, complexity, material cost, and labor cost of the package.

Another prior art shield, as disclosed in U.S. Pat. No. 5,005,106, consists of a sheet-like material that has the appearance of an envelope, where the shield slips over the printed circuit board. The shield protects the printed circuit board from electromagnetic radiation. The shield is designed to be used with packages that have covers constructed of a plastic material. As such, the printed circuit board needs to be insulated from electromagnetic radiation traversing the plastic covers and frames. Furthermore, the sheet-like material of the shield does not provide structural support to the covers and frames of the package.

Thus, there is a need for a simple to manufacture and assemble package that shields the seam of the device package from electromagnetic radiation, while, at the same time, provides a package which is structurally rugged.

SUMMARY OF THE INVENTION

It is an object of the invention to provide a shield which fits within existing peripheral device packages that meet PCMCIA, small PCMCIA package, JEIDA, compact flash package, compact flash plus package, miniature card and ISO standards. It is a further object of the present invention to provide a shield which, when placed into a package holding a printed circuit board, reduces the strength of the electromagnetic field emanating from the package and at the same time reduces the influence of electromagnetic radiation, from other sources, on the printed circuit board held within the package.

In one form of the invention the shield fits within an existing package, where the package contains a printed circuit board. The printed circuit board has a perimeter. The shield has side walls which are dimensioned so as to substantially surround the perimeter of the printed circuit board. At least one of the side walls has an attached side spring. Furthermore, the shield being made of an electrically conductive material. As an option a ground clip can be attached to at least one of the side walls so as to make electrical contact with the printed circuit board. A further option is to provide at least one of the side walls with at least one ground spring. The electrically conductive material of the shield can be a sheet metal-like material which is elastically deformable, yet substantially rigid.

In another form of the invention the shield fits within an existing package. The existing package takes the form of first and second covers. A first frame is attached to the first cover along a portion of a perimeter of the first cover forming a first half of the package and a second frame is attached to the second cover along a portion of a perimeter of the second cover forming a second half of the cover. The first and second frames are then attached to each other thus trapping the shield between the first and second frames. The shield has side walls which have a height substantially equal to the distance between an inner surface of the first cover and an inner surface of the second cover when the package is in an assembled position. The side walls of the shield surround a perimeter of the printed circuit board. The side walls also have side springs for contacting and pressing against an inner side edge of one of the first frame and the second frame. The shield is made of an electrically conductive material.

In yet another embodiment the side walls have ground springs which contact the inner surface of one of the first cover and the second cover. The ground springs make a connection between the shield and the covers.

In another embodiment the first and second covers are made of an electrically conductive material.

In another embodiment the side walls include grounding clips which touch and provide an electrical connection between the shield and the printed circuit board.

In yet another embodiment the side walls include a removed portion which allows a connector of an input/output device to pass through the side walls and connect to the printed circuit board contained within the package.

Thus, Applicant's invention is superior to the prior art. Applicant's invention provides a shield which is insertable into existing device packages that prevents or lessens the strength of an electromagnetic field passing through the side edges of the device package, as well as preventing or lessening the strength of the electromagnetic field passing through the covers of the device package, while decreasing the part count and providing an easy to assemble package. Therefore, Applicant's invention achieves the desired objectives. The prior art fails to disclose a PCB carrying package that shields the PCB from electromagnetic radiation both through the cover and the frame of the package where a portion of the frame of the package is exposed to the environment along the seam, which provides the desired result; while, at the same time the shielding mechanism provides structural support to the other members of the package. Such structural features distinguish Applicants' invention, structurally and functionally, over the prior art of U.S. Pat. Nos. 5,005,106, 5,333,100, 5,397,857, 5,476,387, and 5,505,628.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
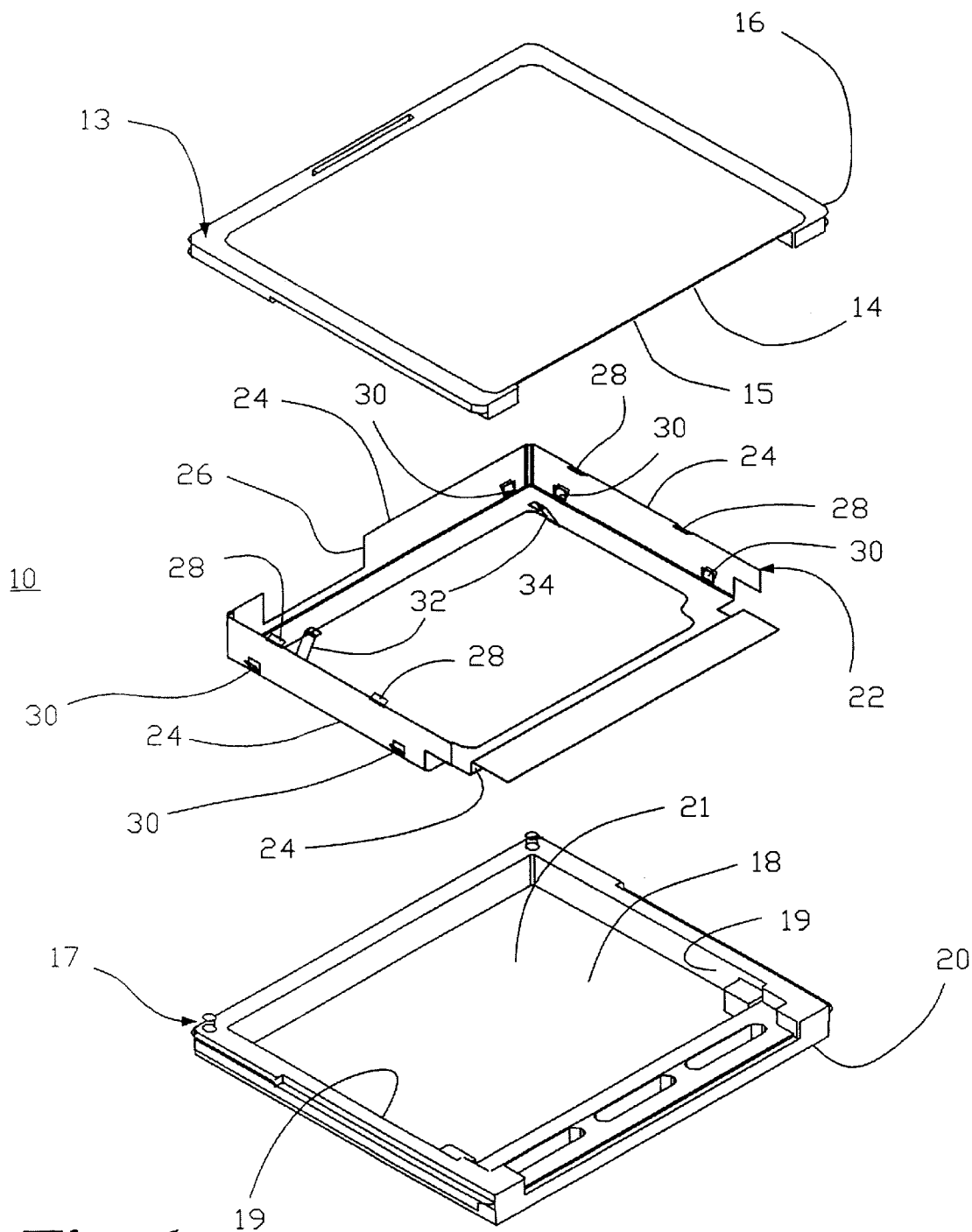
FIG. 1 is an exploded perspective view of the package including the first half of the package, the second half of the package, and the shield.
Figure 2:
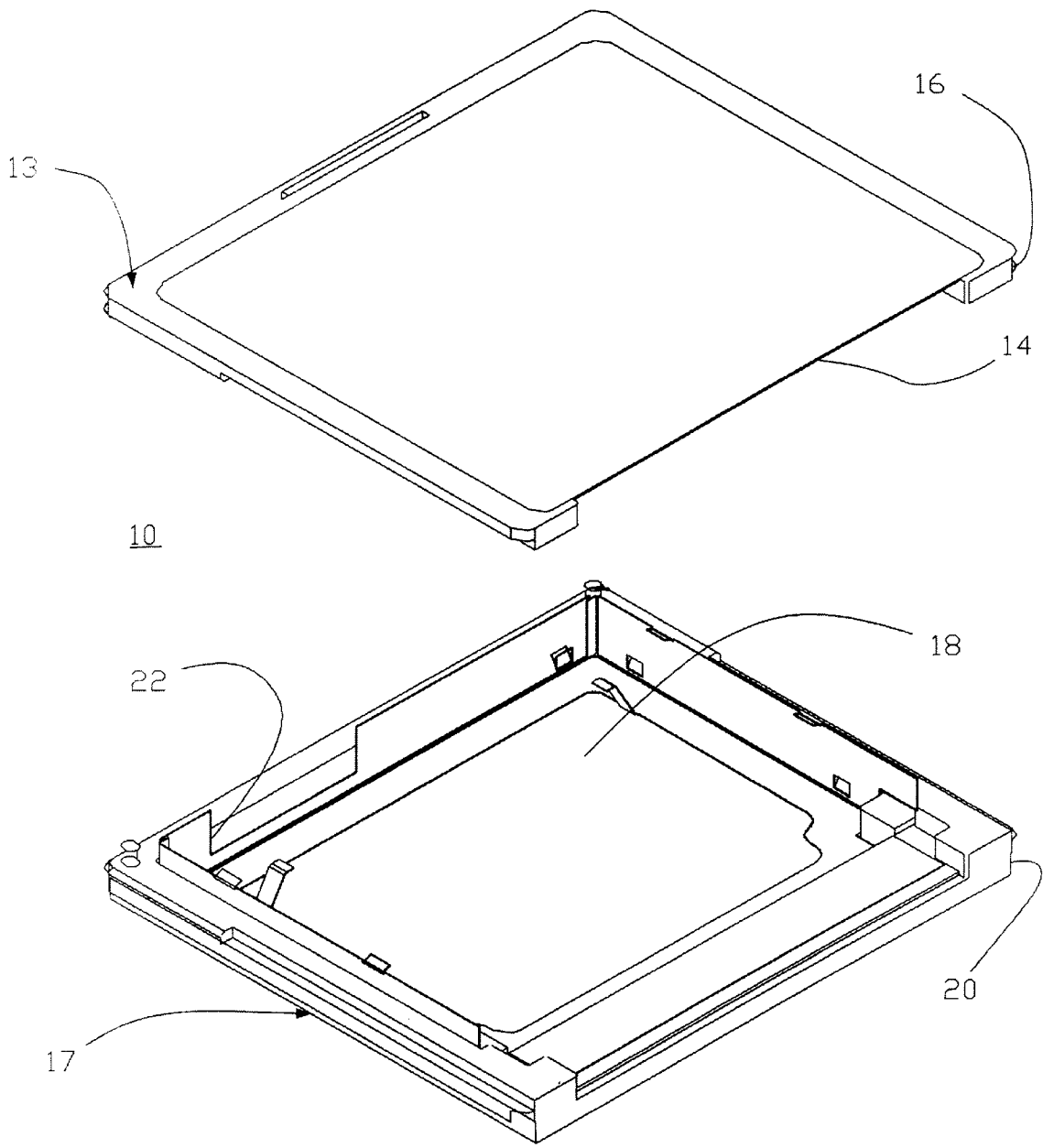
FIG. 2 is an exploded perspective view of the package including the shield positioned within the second half of the package.
Figure 3:
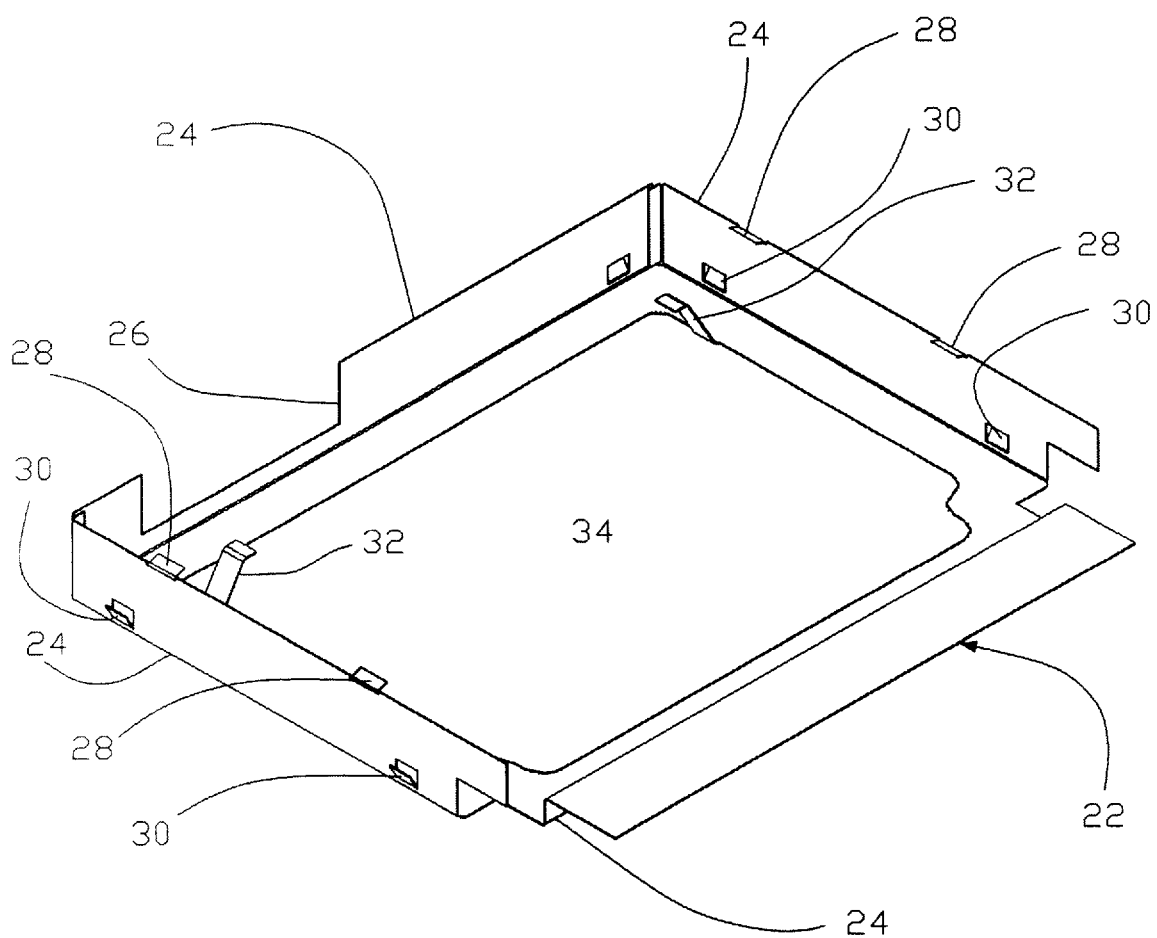
FIG. 3 is a perspective view of the shield.

Referring now to the drawings, wherein like reference numerals designate identical or corresponding parts throughout the several views, and more particularly to FIGS. 1–3 thereof, a first embodiment of the present invention is a shield 22 which is used in a peripheral device package 10 displayed therein. FIG. 1 is an exploded perspective view of the package 10. In the preferred embodiment the package is a compact flash package. However, any package such as a PCMCIA can be used with the shield. The package 10 includes a first half 13 of the package 10, a second half 17 of the package 10, and a shield 22. The first half 13 of the package 10 includes a first cover 14 and a first frame 16. The second half 17 of the package 10 includes a second cover 18 and a second frame 20.

FIG. 2 is an exploded perspective view of the package 10. FIG. 2 shows the shield 22 positioned within the second half 17 of the package 10. The shield is configured so as to accept a printed circuit board, the printed circuit board is not shown. The first half 13 of the package 10 is shown above the shield 22 poised to be attached to the second half 17. The first cover 14 can be constructed of an electrically conductive, stamped, sheet metal material. However, the first cover 14 can be made of a plastic material. The sheet metal material of the first cover 14 adds to the structural integrity of the package 10. The first frame 16 can be constructed of a conventional plastic material. Typically, the material used to form the first frame 16 is injection molded into a mold holding the first cover 14. The material of the first frame 16 flows around the perimeter of the first cover 14 and solidifies. The assembly of the first frame 16 to the first cover 14 results in the formation of the first half 13 of the package 10. However, the method of making the cover and frame are not limited to the process described above, other processes can be used to form the frame and cover.

The construction and description of the second frame 20 and the second cover 18 of the second half 17 of the package 10 is similar to that of the fist frame 16 and first cover 14 of the first half 13 of the package 10, as described above.

In an assembled position, the shield 22 is placed within the second half 17 and then a printed circuit board is placed within the shield 22. The top half 13 of the package 10 is then placed over the second half 17 so that the first frame 16 contacts the second frame 20. The first frame 16 and the second frame 20 are then ultrasonically welded together.

FIG. 3 is a perspective view of the shield 22. The shield 22 has side walls 24 which have a height which is substantially equal to the distance between the inner surface 15 of the first cover 14 and the inner surface 21 of the second cover 18 when the package 10 is in the assembled position. To ensure the shield 22 is in electrical contact with the first cover 14 and the second cover 18, ground springs 28 are attached to the side walls 24, which, in the assembled position, push against the first cover 14. The resulting reaction force causes the shield 22 to also press against the second cover 18, which ensures electrical contact between the shield 22 and the second cover 18. The ground springs 28 take the form of cantilevered portions or tabs of the side walls 24 which are bent inwards and act as a resilient spring. However, any attachment or spring can be interposed between the side walls 24 and the first cover 14 to serve the same purpose. Any number of ground springs 28 can be used. As an option, to eliminate unnecessary material an aperture 34 is formed on one side of the shield 22. However, the aperture 34 can be eliminated by having an entire side containing the shielding material, which is desirable when covers of the package are constructed of an electrically non-conductive material or to ensure isolation from other portions of the circuit board. The spring force generated by the ground springs 28, tends to push apart the first half 13 and the second half 17, which ensures that the shield is grounded to both of the covers.

To secure the shield 22, and hence the printed circuit board, within the assembled package 10, side springs 30 are attached to the side walls 24 which tend to press against inner side edges 19 of the second frame 20. The side springs 30 take the form of cantilevered portions or tabs of the side walls 24 which are bent outwards and act as a resilient spring. However, any attachment or spring can be interposed between the side walls 24 and the second frame 20 to serve the same purpose.

The shield 22 is made of sheet metal. The shape of the shield 22 is produced by bending and cutting of the sheet metal to prescribed dimensions and tolerances. The dimensions and tolerances of the shield 22 are determined so that the finished shield 22 can fit within known pre-existing packages 10. Typically, the packages 10 conform to known industry standards. For example, a compact flash plus package has dimensions of approximately 42.8 mm×36.4 mm×5.0 mm.

Another embodiment includes ground clips 32 protruding from the side walls 24, as shown in FIG. 3. In the assembled position of the package 10, the ground clips 32 contact and press against the printed circuit board. The ground clips 32 ensure that there is an electrical connection between the shield 22 and the printed circuit board. The ground clips 32 take the form of cantilevered portions or tabs of the side walls 24 which are bent inwards and act as a resilient spring. However, any attachment or spring can be interposed between the side walls 24 and the printed circuit board to serve the same purpose.

In another embodiment a removed portion 26 is provided in one of the side walls 24 so that a connector of an input/output device can pass through the side wall 24 and be connected to the printed circuit board, as shown in the figures. The removed portion 26 can also be present for allowing preferred signals to pass there through so as to act as a window. That is, there are applications in which shielding is not desired in a discrete location. The removed portion 26 can be formed in the side walls 24 by cutting away and removing material from the side walls 24. The amount of the removed material to form the removed portion 26 is measured so that it is substantially the same size as the device which must pass through the removed portion 26.

Thus, the first and second covers 14 and 18 are secured to the respective first and second frames 16 and 20, where the frames 16 and 20 are welded to each other. This ensures that the first cover 14 is electrically connected to the shield 22, and that the shield 22 is electrically connected to the second cover 18. Thus, the first cover 14 is electrically connected to the second cover 18. Therefore, the printed circuit board is shielded from electromagnetic fields located outside of the package 10, including regions along side edges of the package 10. Additionally, electromagnetic fields generated by the printed circuit board are substantially contained within the package 10.

Furthermore, regional isolation is available through use of the shield. Regional isolation is important, for example, when a receiver and emitter are located in close proximity to one another. The receiver and emitter need to be shielded from one another so that cross talk does occur between the two different circuits.

Obviously, numerous modifications and variations of the present invention are possible in light of the above teachings. It is therefore to be understood that within the scope of the appended claims, the invention may be practiced otherwise than as specifically described herein.

What is claimed is:

1. A shield for insertion into a package that houses a printed circuit board, wherein the printed circuit board has a perimeter, the shield comprising:

side walls dimensioned so as to substantially surround the perimeter of the printed circuit board; and at least one side spring attached to at least one of the side walls, and wherein the shield is made of an electrically conductive material, and wherein the shield is substantially surrounded by the package.

2. The shield of claim 1, further comprising a ground clip attached to at least one of the side walls for electrically contacting the printed circuit board.

3. The shield of claim 2 wherein the package is a compact flash package.

4. The shield of claim 2 wherein the package is a PCMCIA card.

5. The shield of claim 2 wherein the package is a small PCMCIA card.

6. The shield of claim 2 wherein the package is a miniature card.

7. The shield of claim 2 wherein the package is a JEIDA package.

8. The shield of claim 2 wherein the package is a compact flash plus package.

9. The shield of claim 1, further comprising at least one ground spring attached to at least one of the side walls.

10. The shield of claim 1 wherein at least one of the side walls has a removed portion.

11. The shield of claim 10 wherein the removed portion is dimensioned so as to accommodate therethrough a connector of an input/output device.

12. The shield of claim 1, further comprising an aperture, and wherein the electrically conductive material is substantially rigid.

13. A shield for insertion into a package that houses a printed circuit board, wherein the package includes a first cover attached to a first frame and a second cover attached to a second frame, in an assembled position the package includes the first frame contacting the second frame, the shield surrounding a portion of the printed circuit board, and first cover and the second cover substantially surrounding other portions of the printed circuit board not surrounded by the shield, wherein the first cover and the second cover are separated by the first frame and the second frame, the shield comprising:

side walls of the shield having a height, the height being substantially the same as the distance between an inner surface of the first cover and an inner surface of the second cover when the package is in the assembled position, the side walls surround a perimeter of the printed circuit board; and at least one side spring attached to at least one of the side walls for contacting one of an inner side edge of the frame and an inner side edge of the second frame when the package is in the assembled position, and wherein the shield is made of an electrically conductive material, and wherein the shield is substantially surrounded by the package.

14. The shield of claim 13, further comprising a ground clip attached to at least one of the side walls for electrically contacting the printed circuit board.

15. The shield of claim 13, further comprising at least one ground spring attached to at least one of the side walls for contacting at least one of the inner surface of the first cover and the inner surface of the second cover when the package is in the assembled position.

16. The shield of claim 15, further comprising a ground clip attached to at least one of the side walls for electrically contacting the printed circuit board.

17. The shield of claim 12 wherein at least one of the side walls has a removed portion.

18. The shield of claim 17, further comprising a ground clip attached to at least one of the side walls for electrically contacting the printed circuit board.

19. The shield of claim 17 wherein the removed portion is dimensioned so as to accommodate therethrough a connector of an input/output device.

20. The shield of claim 13, further comprising an aperture.

21. The shield of claim 20, further comprising a ground clip attached to at least one of the side walls for electrically contacting the printed circuit board.

22. The shield of claim 13 wherein the first cover is made of an electrically conductive material and the second cover is made of an electrically conductive material.

23. The shield of claim 22, further comprising a ground clip attached to at least one of the side walls for electrically contacting the printed circuit board.

24. The shield of claim 22, further comprising at least one ground spring attached to at least one of the side walls for contacting at least one of the inner surface of the first cover and the inner surface of the second cover when the package is in the assembled position.

25. The shield of claim 22 wherein one of the side walls has a removed portion.

26. The shield of claim 25 wherein the removed portion is dimensioned so as to accommodate therethrough a connector of an input/output device.

27. The shield of claim 25, further comprising a ground clip attached to at least one of the side walls for electrically contacting the printed circuit board.

28. The shield of claim 27 wherein the package is a compact flash package.

29. The shield of claim 27 wherein the package is a PCMCIA card.

30. The shield of claim 27 wherein the package is a small PCMCIA card.

31. The shield of claim 27 wherein the package is a miniature card.

32. The shield of claim 27 wherein the package is a JEIDA package.

33. The shield of claim 27 wherein the package is a compact flash plus package.

34. A peripheral device comprising:
   a package;
   a printed circuit board having a perimeter, the printed circuit board substantially positioned within the package;
   a shield substantially positioned within the package, the shield having side walls dimensioned so as to substantially surround the perimeter of the printed circuit board, wherein at least one of the side walls has at least one side spring attached thereto, and wherein the shield is made of an electrically conductive material.

* * * * *